US009369270B1

(12) United States Patent
Spijker

(10) Patent No.: US 9,369,270 B1
(45) Date of Patent: Jun. 14, 2016

(54) DUAL-COUPLED PHASE-LOCKED LOOPS FOR CLOCK AND PACKET-BASED SYNCHRONIZATION

(71) Applicant: Integrated Device Technology, Inc., San Jose, CA (US)

(72) Inventor: Menno Spijker, Ottawa (CA)

(73) Assignee: INTEGRATED DEVICE TECHNOLOGY, INC., San Jose, CA (US)

( * ) Notice: Subject to any disclaimer, the term of this patent is extended or adjusted under 35 U.S.C. 154(b) by 203 days.

(21) Appl. No.: 14/212,598

(22) Filed: Mar. 14, 2014

Related U.S. Application Data

(60) Provisional application No. 61/788,659, filed on Mar. 15, 2013.

(51) Int. Cl.
*H03D 3/24* (2006.01)
*H04L 7/033* (2006.01)
*H03L 7/07* (2006.01)

(52) U.S. Cl.
CPC .............. *H04L 7/0331* (2013.01); *H03L 7/07* (2013.01)

(58) Field of Classification Search
CPC ................ H04L 7/033; H04L 7/0337; H04L 2027/0069
USPC ..................... 375/376, 354; 327/156; 713/400
See application file for complete search history.

(56) References Cited

U.S. PATENT DOCUMENTS

| 4,953,185 A * | 8/1990 | Goode .................... H04L 7/033 375/354 |
| 7,148,753 B1 * | 12/2006 | Garlepp .................... H03L 7/07 327/156 |
| 2006/0242445 A1 * | 10/2006 | Aweya ..................... H03L 7/08 713/400 |
| 2014/0192797 A1 * | 7/2014 | Licardie ................ H04J 3/0658 370/350 |

OTHER PUBLICATIONS

Milijevic, Slobodan, "The basics of synchronized Ethernet", EE Times-Asia, 4 pages.
Milijevic, Slobodan, "An introduction to Synchronized Ethernet", Mar. 3, 2009, 7 pages.
"Timing Characteristics of a Synchronous Ethernet Equipment Slave Clock", International Telecommunication Union, Recommendation ITU-T G.8262/Y.1362, Jul. 2010, 34 pages.
Wikipedia, the free encyclopedia, "Synchronous Ethernet", Retrieved on: Mar. 4, 2014, 6 pages. Retrieved from: https://en.wikipedia.org/wiki/Synchronous_Ethernet.

* cited by examiner

*Primary Examiner* — Daniel Washburn
*Assistant Examiner* — Fitwi Hailegiorgis
(74) *Attorney, Agent, or Firm* — Myers Bigel & Sibley

(57) ABSTRACT

A Synchronous Ethernet (SyncE) network device includes a pair of phase-locked loops including a first phase-locked loop responsive to a SyncE input clock and a second phase-locked loop coupled to the first phase-locked loop. The second phase-locked loop is configured to be simultaneously lockable to both the SyncE input clock via the first phase-locked loop and an IEEE 1588 packet stream, during a locked mode of operation, and also lockable to the SyncE input clock during a holdover mode of operation which is triggered in response to a failure of the IEEE 1588 packet stream.

10 Claims, 7 Drawing Sheets

DUAL-COUPLED PHASE-LOCKED LOOPS FOR CLOCK AND PACKET-BASED SYNCHRONIZATION

REFERENCE TO PRIORITY APPLICATION

This application claims priority to U.S. Provisional Application Ser. No. 61/788,659, filed Mar. 15, 2013, the disclosure of which is hereby incorporated herein by reference.

CROSS-REFERENCE TO RELATED APPLICATION

This application is related to U.S. application Ser. No. 14/200,619, filed Mar. 7, 2014, entitled "Methods of Performing Time-of-Day Synchronization in Packet Processing Networks," the disclosure of which is hereby incorporated herein by reference.

FIELD OF THE INVENTION

The present invention relates to integrated circuit devices and, more particularly, to clock synchronization circuits for synchronous ethernet applications.

BACKGROUND OF THE INVENTION

Synchronous Ethernet (SyncE) is an ITU-T standard for computer networking that facilitates the transference of clock signals over the Ethernet physical layer. A main difference between SyncE and "regular" Ethernet has to do with the carrier clock. In SyncE, the carrier clock is synchronized and traceable to a primary reference clock (PRC) whereas with regular Ethernet the carrier clock is a locally generated free running clock. Nonetheless, in both cases, the carrier clock is extracted from data received by the physical layer (PHY). For a phase-locked loop (PLL) device that needs to lock to a SyncE clock, the process is essentially the same as locking to any other telecom-type clock with the frequency being a function of application. The requirements of SyncE with respect to pull-in range, wander/jitter tolerance, wander/jitter generation, etc. are described in a recommendation of the International Telecommunication Union: ITU-T G.8262/Y.1362 2010-07, Timing Characteristics of a Synchronous Ethernet Equipment Slave Clock.

In a strictly SyncE application, there is no need for a 1 pulse-per-second (PPS) signal. Only a digital PLL (DPLL) controls the phase and frequency of the output clocks and frame pulses, if applicable. However, in other applications, a user could require applying a static phase offset to the output clocks and frame pulses in order to trim away delays in a system. This could be a static input-output delay and/or (multiple) output-output delay(s). Because SyncE does not transmit any lower rate frame phase information, it is typically not possible to align frame pulses and timing pulses across a network using just SyncE.

IEEE 1588 is a standard that defines the distribution of timing over packet based networks. As will be understood by those skilled in the art, the timing is no longer carried by a physical clock. Instead, timestamps are sent back and forth between a server (e.g., master) and a client (e.g., slave). The timestamps from the server are linked to the PRC (Cesium, Rubidium, GPS, etc.), whereas the timestamps of the client are linked to the clock recovered by the client (e.g., from packet data). In particular, the client can extract the timing from a collection of received and locally generated timestamps using, for example, an algorithm running on a microprocessor at the client. The algorithm drives a digitally-controlled oscillator (DCO) that then generates the physical clock and 1PPS timing pulse. Ideally, the 1PPS timing pulse generated by the client is phase aligned with the 1PPS signal generated by the server. The algorithm needs to control both the frequency of the output clock(s) and frame/timing pulses as well as the phase of the 1PPS timing pulse. The latter is preferably independent of the output clock frequency notwithstanding the fact that the frequency and phase are hard related to each other. This independence is due to the fact that the phase/position of the 1PPS pulse during the initial snap alignment can be adjusted without changing the frequency and phase of the output clocks.

Using a combination of both SyncE and IEEE 1588 for synchronization typically provides the stability and precision of a physical SyncE clock with the ability to synchronize frame/timing pulses in accordance with IEEE 1588. The SyncE clock and the IEEE 1588 timestamps may or may not be traceable to the same primary timing reference. But, if the SyncE clock and the IEEE 1588 timestamps are traceable to the same primary timing reference, then the SyncE clock can be used for: (i) frequency synchronization of the output clock and the frame/timing pulse; and (ii) phase alignment of the output clock to the input SyncE clock. This can be achieved by the standard function of the PLL, which is the same as in a regular telecom clock (E1, T1, Sonet etc) application. In addition, the IEEE 1588 timestamps can be used to calculate the phase offset between the 1PPS pulse of the server and the 1PPS pulse of the client and then align the two pulses by moving the 1PPS pulse of the client (in phase). The client typically should be able to move the 1PPS pulse by ±0.5 sec.

An alternative way of combining SyncE and IEEE 1588 is by switching back and forth between the two timing references. For this to work, the SyncE clock and the IEEE 1588 timing must be traceable to the same PRC. Initially, a frequency lock is achieved using the SyncE clock as the input reference. Then, the client switches to the IEEE 1588 packet stream as the timing reference. Now the phase of the 1PPS and potentially the output clock pulse is adjusted through the 1PPS coarse alignment and the fine input-output alignment. If the IEEE 1588 timing gets corrupted, then the client makes a hitless reference switch back to the SyncE clock. If the IEEE 1588 timing comes back, the client makes a non-hitless reference switch from the SyncE clock back to the IEEE 1588 timing and gradually pulls-in the phase error from the previous hitless reference switch. Due to the non-zero residual phase error of the hitless reference switching to the SyncE clock, some wander will occur. But the non-hitless reference switch back to the IEEE 1588 timing prevents the accumulation of wander.

Practical implementations of these concepts typically use a digitally-controlled oscillator (DCO) for frequency synthesis and to support IEEE 1588. As illustrated by FIG. 1, a DCO can be set up as an accumulator (e.g., phase accumulator) running at the frequency of the system clock (sysclk). The DCO output clock is very accurate in frequency but may have a pp-jitter of 1 sysclk cycle. Various techniques including the use of a tapped delay line or an analog PLL within a de-jitter circuit can be used to reduce any intrinsic jitter associated with the output of the DCO. The input frequency word to the DCO comes from an IEEE 1588 synchronization algorithm running on an external microprocessor. The 1PPS pulse is divided down from the DCO clock using a counter and comparator logic so that when the counter in incremented to the comparator value, a pulse is generated. The output clock (clk) and 1PPS pulse frequency are directly controlled by the DCO input frequency word.

The phase of the 1PPS pulse can also be adjusted in steps of 1 DCO clock cycle by changing the comparator value, which is shown as: "1PPS phase word". This technique is fast but provides only relatively coarse phase adjustment, which is often referred to as "snap-alignment." Moreover, by adjusting the frequency of the DCO, the phase of both the output clock (clk) and 1PPS pulse can be changed. The phase change is the product of the frequency change and the duration of the frequency change. Since the DCO's frequency word has a very fine resolution, the phase of the output clock (clk) and 1PPS pulse can be adjusted in very fine steps. However, if the maximum DCO frequency change is limited to 100 ppm, then larger phase changes may require a relatively long adjustment time. For example, a phase change of 0.5 sec may take $0.5/(1 \times 10^{-4})=5000$ sec (i.e., 1:23 hr). For smaller fine resolution phase changes, temporarily changing the DCO frequency is typically a good method.

Because the frequency word comes from a microprocessor with relatively inaccurate timing, an internal hardware based timer should be incorporated to ensure that the frequency change is applied for a precise duration. In some cases, an internal timer can be used to update the DCO frequency word (from a register) every 100 ms. This internal timer must be running on the same clock that is the system/master clock of the DCO. With a DCO frequency resolution of $1 \times 10^{-11}$, phase adjustments with a resolution of 1 ps can be made. If the timer also generates an interrupt to the microprocessor every 100 ms, then the microprocessor can readily synchronize to the DCO. Alternatively, if the 1PPS pulse is generated by a DPLL, which is locked to a (SyncE) reference clock instead of just a DCO, then the phase of the 1PPS pulse can be changed by simply adding an input-to-output phase offset to the DPLL. This will also adjust the phase of both the output clock and the 1PPS pulse.

FIG. 2 illustrates a block diagram of a circuit containing a DPLL core and divider for synchronizing an output clock signal (clk) to a SyncE network clock (i.e., clk is phase aligned and frequency locked to the SyncE clk). But, this circuit does not provide alignment of frame or timing pulses. In contrast, FIG. 3 shows an application diagram for synchronization to an IEEE 1588 packet stream. An external processor runs an algorithm and updates a frequency offset register of the DPLL. As a result, the output clock (clk) and timing pulse (1PPS) are frequency locked to the timing server and the timing pulse is phase aligned to the 1PPS timing pulse of the server.

FIG. 4 illustrates a block diagram of a circuit that supports synchronization to both a SyncE clock and an IEEE 1588 packet stream, which are traceable to the same PRC. The illustrated DPLL core locks to the SyncE clock, and the output clock (clk) and timing pulse (1PPS) are frequency locked to the SyncE clock. An external processor runs an algorithm and updates the phase alignment of the 1PPS pulse. The "coarse" phase alignment is in steps of −0.6 ns. If a finer alignment is needed, then the input-output phase offset adjustment can be used to fine tune the 1PPS and clock phase. This setup can be used when no separate timing paths are required for the SyncE output clock and an IEEE 1588 clock and 1PPS. Ideally, the algorithm adjusts the 1PPS pulses and possibly the output clock phase once, upon initialization, and the DPLL maintains alignment by tracking the input SyncE clock.

These above-described scenarios advantageously require the use of only one DPLL core, but are limited by the requirement that the SyncE clock and the IEEE 1588 timestamps should be traceable to the same primary timing reference. Thus, there continues to be a need for alternative ways of combining SyncE and IEEE 1588 when the SyncE clock and timestamps are not traceable to the same PRC.

SUMMARY OF THE INVENTION

Integrated circuit devices according to embodiments of the invention include a pair of coupled phase-locked loops. This pair of phase-locked loops includes a first phase-locked loop, which is responsive to a first clock, and a second phase-locked loop, which is configured to indirectly track the first clock through the first phase-locked loop when the second phase-locked loop is disposed in holdover and locked modes of operation. According to some of these embodiments of the invention, the first phase-locked loop includes a first loop filter and a first digitally-controlled oscillator responsive to a first output signal generated by the first loop filter. The second phase-locked loop also includes a second loop filter, which is responsive to a second output signal generated by the first loop filter, and a second digitally-controlled oscillator responsive to an output signal generated by the second loop filter.

According to additional embodiments of the invention, the first phase-locked loop may be configured to support a programmable mode whereby the first and second output signals generated by the first loop filter are equivalent. Moreover, in the event the first loop filter includes at least one low-pass filter, then the first phase-locked loop may be configured to support a first programmable mode whereby the first and second output signals generated by the first loop filter are equivalent and a second programmable mode whereby the second output signal is generated by the low-pass filter but the first output signal is not.

Additional embodiments of the invention can include a Synchronous Ethernet (SyncE) network device containing a pair of coupled phase-locked loops. This pair of phase-locked loops includes a first phase-locked loop, which is responsive to a SyncE input clock, and a second phase-locked loop that is coupled to the first phase-locked loop. The second phase-locked loop is configured to be simultaneously lockable to both the SyncE input clock via the first phase-locked loop and an IEEE 1588 packet stream during a locked mode of operation and also lockable to the SyncE input clock during a holdover mode of operation. This holdover mode of operation may be triggered in response to a failure of the IEEE 1588 packet stream.

According to some of these embodiments of the invention, the first phase-locked loop can include a first loop filter and a first digitally-controlled oscillator. This first loop filter may include selection circuitry, which is configured to selectively provide a second loop filter within the second phase-locked loop with the same frequency offset provided to the first digitally-controlled oscillator when disposed in a first selection state. This selection circuitry may be further configured to selectively provide the second loop filter with the long term frequency offset of the first phase-locked loop when disposed in a second selection state. The first phase-locked loop may also include a low pass filter, which is configured to receive the long term frequency offset of the first phase-locked loop at an input thereof. In addition, the selection circuitry may be configured to selectively provide the second loop filter with a post-filtered frequency offset from an output of the low pass filter when disposed in a third selection state.

According to still further embodiments of the invention, the second phase-locked loop may include a phase detector, a loop filter and selection circuitry electrically coupled to the phase detector and the loop filter. This selection circuitry may be configured to selectively pass a phase offset signal from an output of the phase detector to an input of the loop filter when disposed in a first selection state and pass phase information associated with the IEEE 1588 packet stream to the input of the loop filter when disposed in a second selection state. This phase information associated with the IEEE 1588 packet stream may be received at a serial interface of the network device.

According to still further embodiments of the invention, the second phase-locked loop is configured to generate a one-pulse-per-second (1PPS) timing signal at an output thereof, which is also fed back to a first input of the phase detector. This second phase-locked loop may also include a divider, which is configured to generate the 1PPS timing signal in response to an output clock signal. The phase information associated with the IEEE 1588 packet stream may be provided to an input of this divider.

According to still further embodiments of the invention, a Synchronous Ethernet (SyncE) network device may be provided with a pair of phase-locked loops. This pair of phase-locked loops can include a first phase-locked loop responsive to a SyncE input clock and a second phase-locked loop configured to generate a one-pulse-per-second (1PPS) timing signal. The pair of phase-locked loops is configured to continuously add a frequency offset value associated with the first phase-locked loop to a frequency offset value associated with the second phase-locked loop during a locked mode of operation. The second phase-locked loop may also be configured to track the SyncE input clock through a first loop filter within the first phase-locked loop when the second phase-locked loop is disposed in a holdover mode of operation.

DETAILED DESCRIPTION OF EMBODIMENTS

Figure 1:
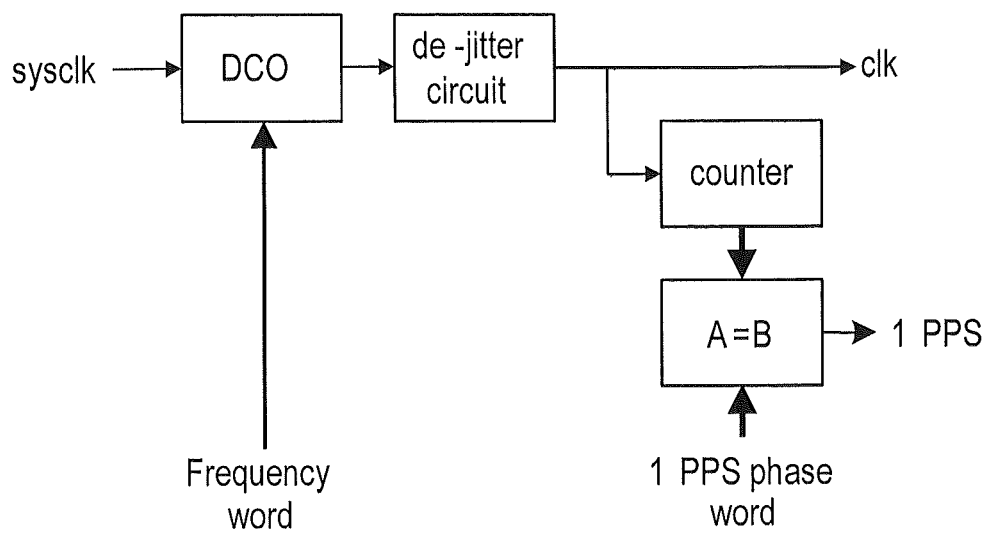
FIG. 1 is a block diagram of a digitally-controlled oscillator (DCO) according to the prior art.
Figure 2:
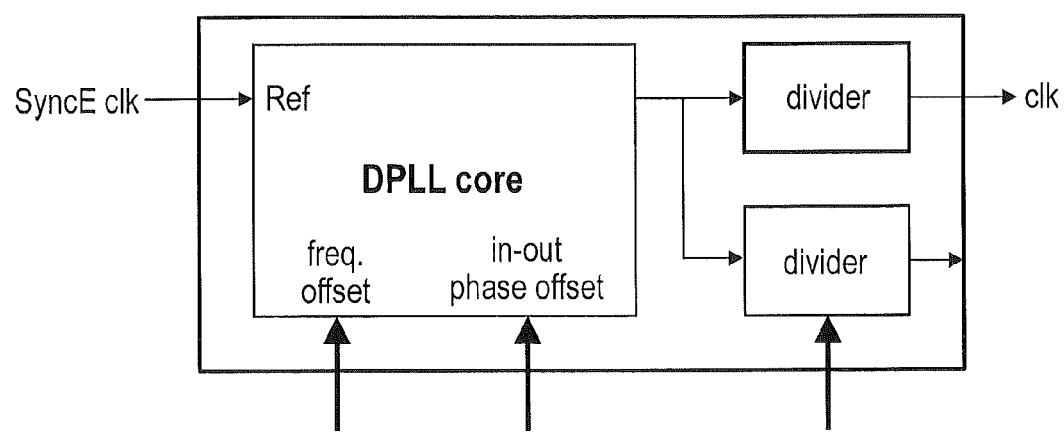
FIG. 2 is an application diagram of a digital phase-locked loop (DPLL) for synchronization to a SyncE network clock, according to the prior art.
Figure 3:
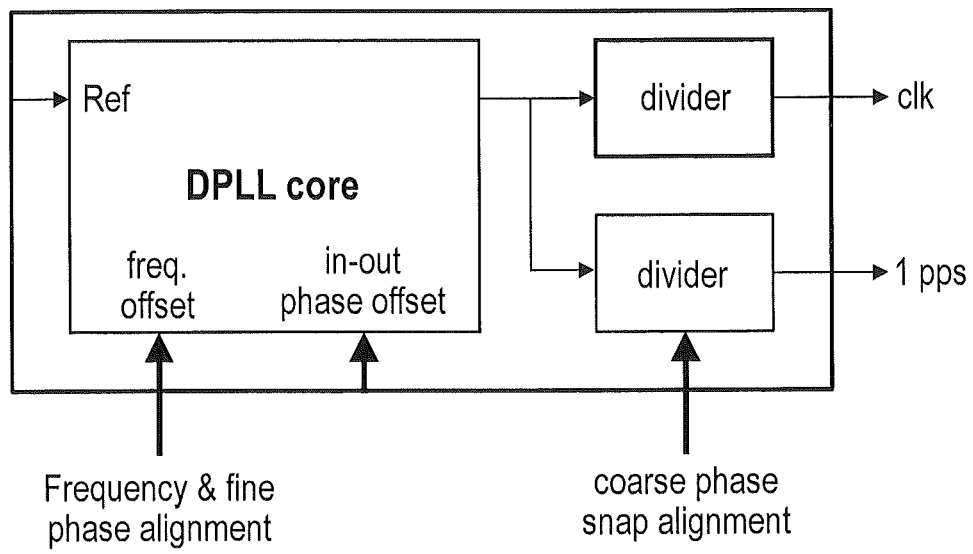
FIG. 3 is an application diagram of a digital phase-locked loop (DPLL) for synchronization to an IEEE 1588 packet stream, according to the prior art.
Figure 4:
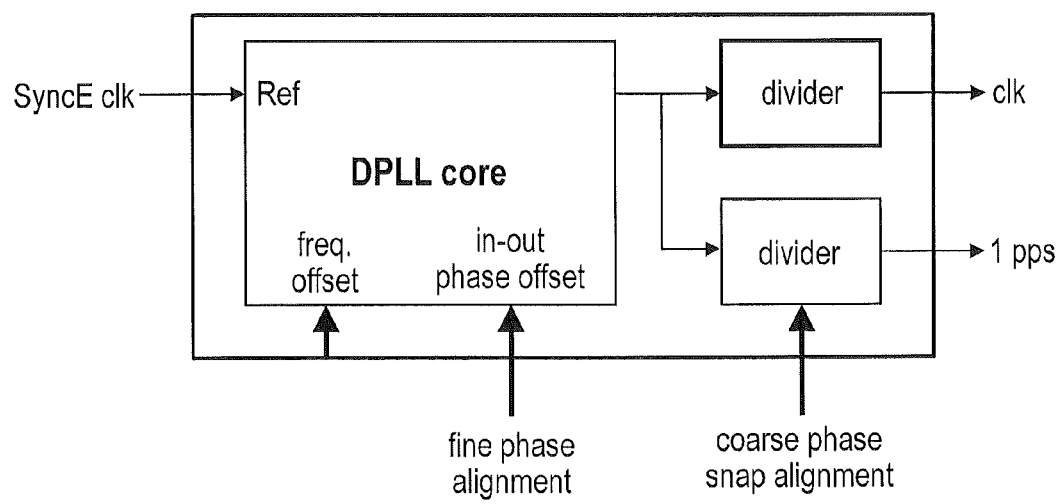
FIG. 4 is an application diagram of a digital phase-locked loop (DPLL) for synchronization to a SyncE network clock and an IEEE 1588 packet stream, which are both traceable to a single primary reference clock (PRC), according to the prior art.

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout.

It will be understood that when an element or layer is referred to as being "on," "connected to" or "coupled to" another element or layer (and variants thereof), it can be directly on, connected or coupled to the other element or layer or intervening elements or layers may be present. In contrast, when an element is referred to as being "directly on," "directly connected to" or "directly coupled to" another element or layer (and variants thereof), there are no intervening elements or layers present. Like reference numerals refer to like elements throughout.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprising", "including", "having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As will now be described more fully with respect to FIGS. 5, 6A-6B and 7, a dual-coupled digital phase-locked loop (DPLL) architecture is proposed for synchronization to a electrical clock (e.g., SyncE clock) and an IEEE 1588 packet stream at the same time. The two DPLLs have respective loop filters coupled to each other in order to provide a recovered clock (e.g., TSCK), which is locked to both the electrical clock and the packet stream. In particular, with Synchronous Ethernet (SyncE) networks, frequency synchronization is done through a SyncE network clock while phase alignment is done with an IEEE1588 packet stream. Typically a 1 Pulse Per Second (1PPS) timing pulse and a high frequency clock need to be generated at a network node. For best performance, the 1PPS signal should be generated from both the SyncE clock and the IEEE 1588 packet stream. A very low frequency cut-off low pass filter may be used to suppress wander from the SyncE clock and the IEEE 1588 packet stream and a mildly filtered network clock may be generated for data transmission further down the network.

According to embodiments of the invention, if the IEEE 1588 packet stream is disrupted, the 1PPS signal generation will fall back to the SyncE clock as its primary source because the SyncE clock will sustain a high level of frequency accuracy without the need of an expensive local oven-controlled crystal oscillator. To achieve this goal, a dual DPLL approach is proposed. The first DPLL with a moderate low pass filter is provided, which is locked to the SyncE input clock (e.g., SyncE-RxCk) and generates the SyncE output clock (e.g., SyncE-TxCk). In contrast, the second DPLL receives its timing information from an algorithm running external to the DPLL (e.g., within a host processor), which uses the timestamps from the IEEE 1588 packet stream. These first and second DPLLs are also referred to herein as "SyncE DPLL" and "1588 DPLL," respectively. The 1588 DPLL may use a very low bandwidth low pass filter to attenuate the wander from the IEEE 1588 packet stream. Advantageously, a frequency offset value of the SyncE DPLL is continuously added to the frequency offset value of the 1588 DPLL that generates the 1PPS signal.

Both DPLLs may use a proportional-integrator type architecture for the loop filter, which makes it relatively easy to extract the frequency offset of the DPLL. The phase corrections are typically done through the proportional path while the integrator corrects for frequency offset of the input reference clock. Once a DPLL is locked, the proportional path is zero on average and the integrator contains a constant non-zero value representing the frequency offset from the DPLLs nominal or center frequency. The input to the integrator is the attenuated value from the proportional path. As will be understood by those skilled in the art, the attenuation is necessary to provide sufficient damping and thereby limit the overshoot in the DPLL's transfer function. A typical frequency domain overshoot limit for telecom applications is 2% or 0.2 dB. The overshoot limit implies a damping that effectively lowers the bandwidth of the frequency domain response compared to the time/phase domain response. Thus, if the DPLL bandwidth with respect to jitter attenuation is 1 Hz, then with a 2% overshoot limit, the bandwidth with respect to frequency tracking is approximately 50 times lower at 0.02 Hz. The integrator value may be further filtered by an additional low pass filter (LPF) and the low pass filter output may be used as the frequency value when the DPLL enters a holdover mode.

Figure 5:
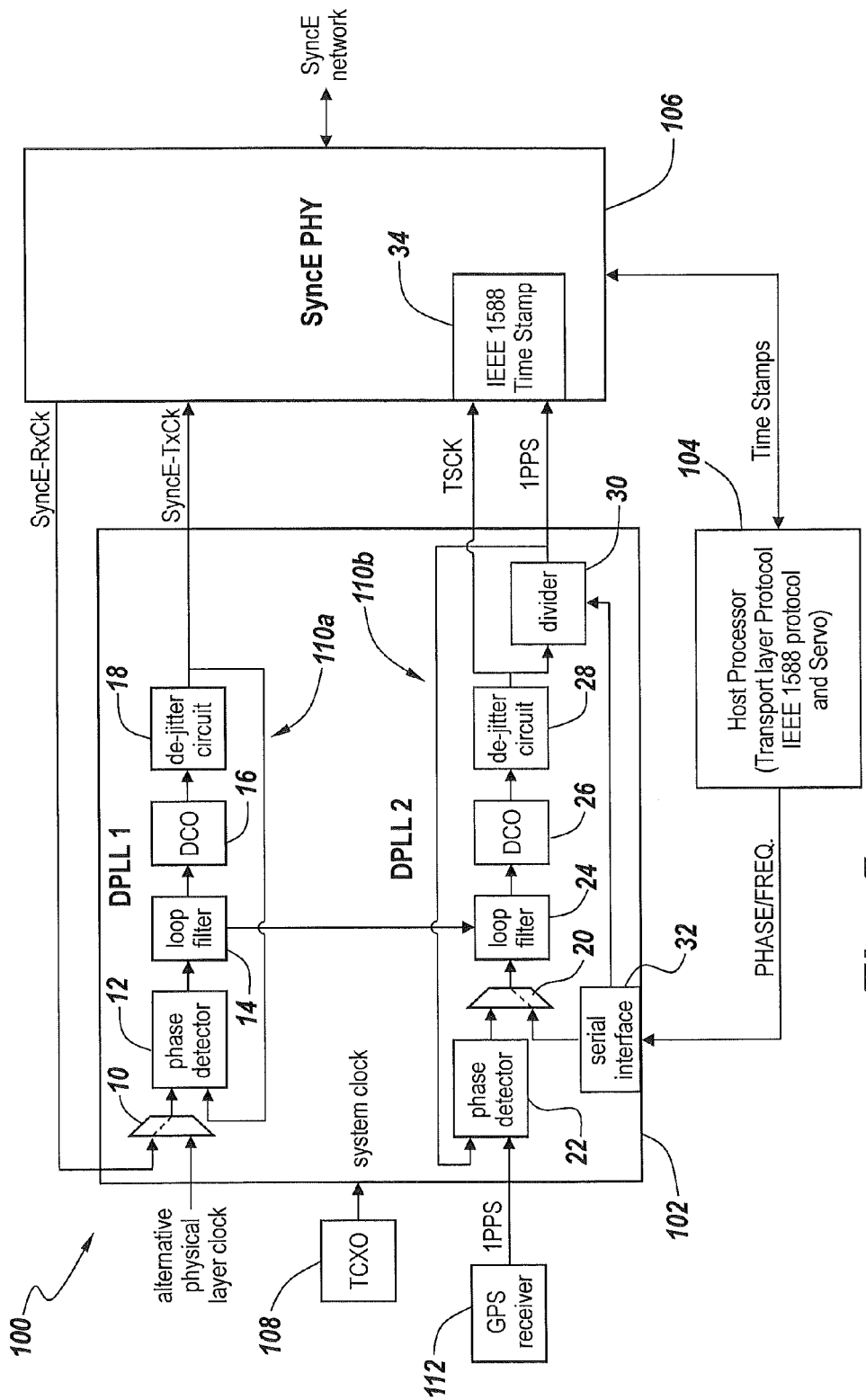
FIG. 5 is a block diagram of a Synchronous Ethernet (SyncE) network device according to an embodiment of the present invention.
Figure 7:
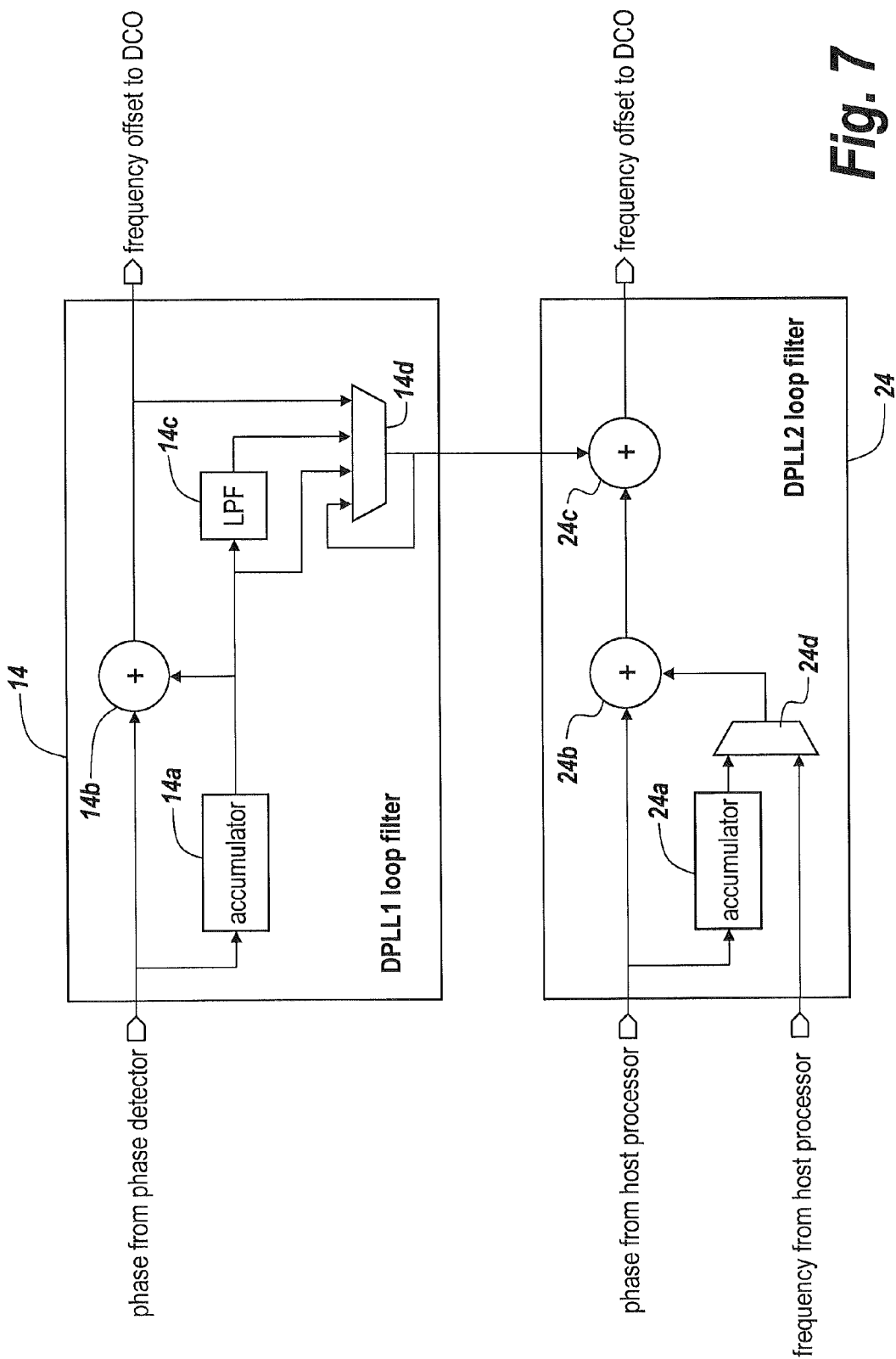
FIG. 7 is a detailed block diagram illustrating an embodiment of the loop filters within the phase-locked loops (DPLL1, DPLL2) of FIG. 5, according to the present invention.

The integrator value of the SyncE DPLL represents the filtered combined frequency offset of the input SyncE clock and a local oscillator (e.g., TCXO). If the 1588 DPLL is using the same local oscillator, which is preferable, then the 1588 DPLL can, apply the same frequency offset on top of the frequency offset value from the 1588 algorithm performed by the host processor. This effectively removes the frequency of the local oscillator from the frequency offset of the 1588 DPLL, which means a less accurate and therefore cheaper local oscillator can be used. If necessary, the frequency offset of the SyncE DPLL can also be taken from the additional holdover low pass filter to provide additional wander filtering on the SyncE input clock for the 1588 DPLL. As shown by FIGS. 5 and 7, in the 1588 DPLL, the frequency offset from the SyncE DPLL is added to the output of the integrator in the 1588 DPLL loop filter. The fact that both the SyncE DPLL and the 1588 DPLL can use the same local oscillator provides an important commercial advantage to the embodiments described herein, which can even include the possibility of having the two DPLLs on different chips.

Referring now to FIG. 5, a Synchronous Ethernet (SyncE) network device 100 according to an embodiment of the present invention is illustrated as including an integrated circuit network device (e.g., client) 102, a Synchronous Ethernet physical layer (SyncE PHY) 106, a host processor 104, a local temperature-controlled crystal oscillator (TCXO) 108, which generates a system clock, and a GPS receiver 112, connected as illustrated. As described more fully in the commonly assigned U.S. application Ser. No. 14/200,619, filed Mar. 7, 2014, entitled "Methods of Performing Time-of-Day Synchronization in Packet Processing Networks," which is hereby incorporated herein by reference, the host processor 104 may process incoming time stamps (e.g., from a server) and generate outgoing time stamps for transmission across the SyncE network (e.g., to the server).

The integrated circuit device 102 of FIG. 5 is illustrated as including, among other things, a first digital phase-locked loop (DPLL1) 110a and a second digital phase-locked loop (DPLL2) 110b, which may be embodied on the same integrated circuit chip. The first digital phase-locked loop 110a is illustrated as generating a Synchronous Ethernet output/transmit clock (SyncE-TxCk) in response to a Synchronous Ethernet input/received clock (SyncE-RxCk). As shown, the Synchronous Ethernet output/transmit clock (SyncE-TxCk) and the Synchronous Ethernet input/received clock (SyncE-RxCk) are provided to and from the physical layer PHY 106, which communicates with a SyncE network (e.g., server) using techniques and protocols known to those skilled in the art. This embodiment of the first digital phase-locked loop 110a is illustrated as including a first phase detector 12, a first loop filter 14, a first digitally-controlled oscillator 16 and a first de-jitter circuit 18. A first selection circuit 10 (e.g., multiplexer) is also provided to selectively pass either the Synchronous Ethernet input clock SyncE-RxCk or an alternate clock (e.g., physical layer clock) to the first phase detector 12 in response to a first selection signal (e.g., MUX control signal).

The second digital phase-locked loop 110b is illustrated as generating a time stamp clock (TSCK) and a one-pulse-per-second (1PPS) timing signal in response to either: (i) a GPS-based 1PPS timing reference provided by a GPS receiver 112, or (ii) timing information (e.g., phase/frequency information associated with the IEEE 1588 packet stream) received at a serial interface 32 of the device 102. This timing information is illustrated as being generated by a host processor 104, which runs, among other things, algorithms associated with an IEEE 1588 protocol and servo. As shown, the time stamp clock (TSCK) and the one-pulse-per-second (1PPS) timing signal are provided to an IEEE 1588 time stamp processing circuit 34 within the SyncE PHY 106.

This embodiment of the second digital phase-locked loop 110b is illustrated as including a second phase detector 22, a second loop filter 24, a second digitally-controlled oscillator 26, a second de-jitter circuit 28 and a divider 30, which is responsive to the phase/frequency information received from the host processor 104. A second selection circuit 20 (e.g., multiplexer) is also provided to selectively pass either an output signal generated by the phase detector 22 or the phase/frequency information received from the host processor 104 to the second loop filter in response to a second selection signal (e.g., MUX control signal). In the event the second selection circuit 20 is controlled to pass the phase/frequency information, then the feedback loop of DPLL2 extends indirectly through the physical layer PHY 106 and the host processor 104 to the loop filter (via the serial interface circuit 32). The server (i.e., received) timestamps and the locally generated timestamps can therefore be treated as the input "clock" and feedback "clock," respectively.

As will be understood by those skilled in the art, the IEEE 1588 standard provides a set of formulas to calculate the phase offset between the master/server and slave/client from incoming and outgoing timestamps. The host processor 104 does the math and calculates the server-client phase offset from the timestamps. The phase offset is written through the serial interface 32 to the second loop filter 24 in a manner similar to the way the second phase detector 22 could be selected to write the phase offset between the input 1PPS timing signal (from the GPS receiver 112) and the fed back 1PPS timing signal from an output of the divider 30. In response, the second loop filter 24 does the filtering and writes a frequency offset to the second digitally-controlled oscillator 26. As explained more fully hereinbelow, the frequency offset provided to the second digitally-controlled oscillator 26 includes a frequency offset contribution provided by the first loop filter 14.

Figure 6A:
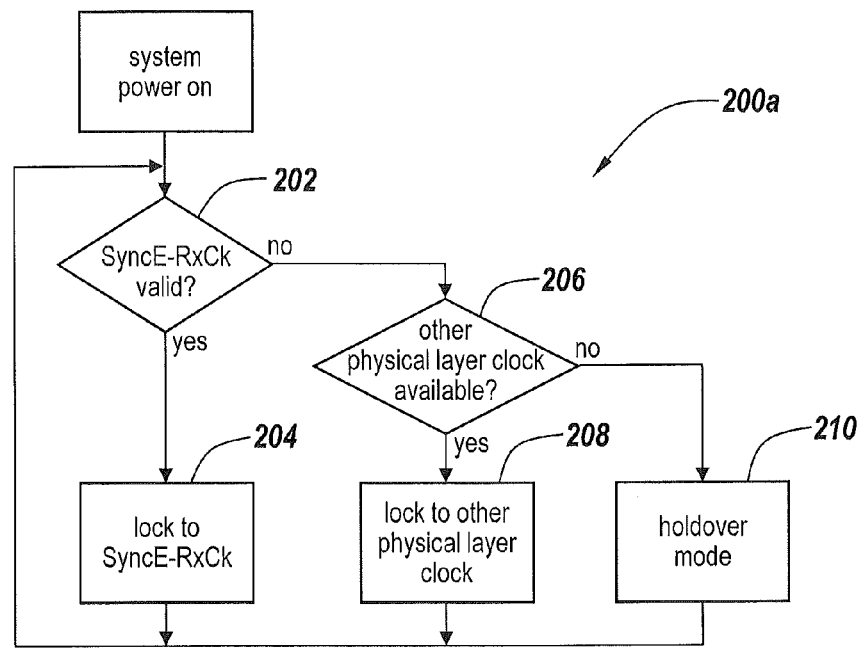
FIG. 6A is a flow diagram that illustrates operations of a SyncE-DPLL (DPLL1) according to an embodiment of the present invention.

FIG. 6A is a flow diagram that illustrates operations 200a of a SyncE-DPLL 110a (DPLL1) according to an embodiment of the present invention. As shown, these operations 200a include a check to determine whether a received SyncE clock (i.e., SyncE-RxCk) is valid or not, Block 202. If yes, operations are performed to lock DPLL1 to SyncE-RxCk, Block 204. If not, another check is made to determine whether an alternative physical layer clock is available (e.g., available at an input of the multiplexer 10 within DPLL1), Block 206. If an alternative clock is available, then operations are performed to lock DPLL1 to the alternative physical layer clock, Block 208. But, if an alternative clock is not available, then DPLL1 is disposed in a holdover mode of operation, Block 210.

Figure 6B:
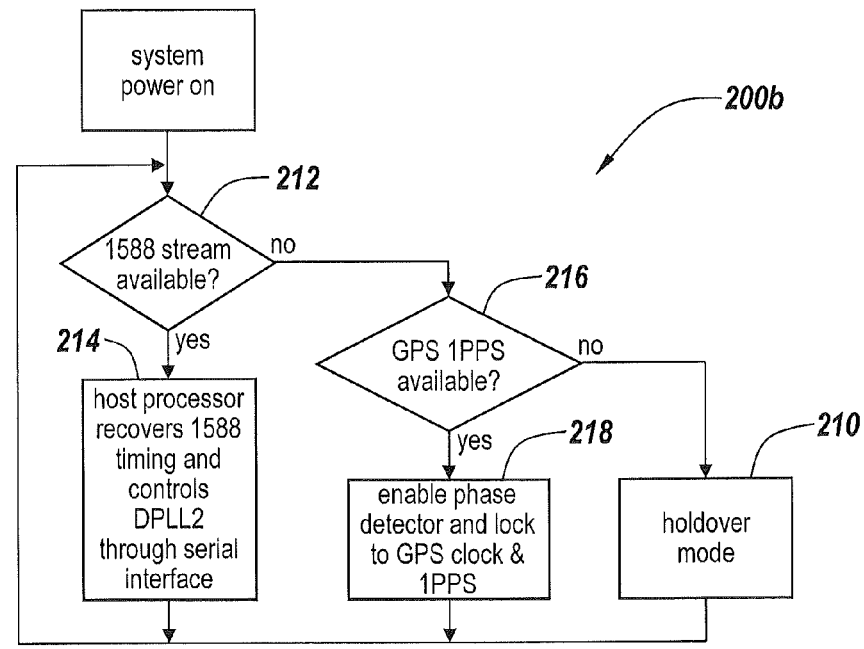
FIG. 6B is a flow diagram that illustrates operations of an IEEE 1588 DPLL (DPLL2) according to an embodiment of the present invention.

FIG. 6B is a flow diagram that illustrates operations 200b of a 1588-DPLL 110b (DPLL2) according to an embodiment of the present invention. As shown, these operations 200b include a check to determine whether an IEEE 1588 packet stream is available, Block 212. If yes, the host processor 104 recovers the 1588 timing and controls DPLL2 through the serial interface 32, Block 214. If not, another check is made to determine whether a 1PPS timing signal is available from a GPS receiver 112, Block 216. If not, the DPLL2 is disposed in a holdover mode of operation and maintains the current frequency and phase offset, Block 210. Moreover, because the SyncE input clock (SyncE-RxCk) is still available and DPLL2 is tracking the SyncE input clock through DPLL1, the holdover accuracy of DPLL2 equals the accuracy of the SyncE input clock instead of the TCXO 108. Finally, if the check at Block 216 determines that the 1PPS timing signal is available, then the phase detector 22 is enabled and the DPLL2 is locked to the 1PPS timing signal generated by the GPS receiver 112, Block 218. Then, when the 1588 timing packet stream is ultimately restored, the DPLL2 will switch back to an original configuration.

FIG. 7 is a detailed block diagram illustrating an embodiment of the loop filters 14, 24 within the phase-locked loops (DPLL1, DPLL2) of FIG. 5. As shown, the DPLL1 loop filter 14 includes an accumulator 14a and adder 14b, which collectively operate as a low pass filter that receives an offset phase from the first phase detector 12. The DPLL1 loop filter 14 also advantageously includes an additional low pass filter 14c (LPF) in combination with a multi-input selection circuit 14d (e.g., 4-input multiplexer). The multi-input selection circuit 14d chooses what frequency offset value is transferred to the DPPL2 for summation within the second loop filter 24. As shown, the selection circuit 14d may select:

(1) the same frequency offset value provided to the first digitally-controlled oscillator 16 (from adder 14b);
(2) a post-filtered frequency offset value (from LPF 14c);
(3) a long term frequency offset value of DPLL1 (from accumulator 14a); or
(4) hold the current frequency offset value.

As will be understood by those skilled in the art, the accumulator 14a within the DPPL1 loop filter 14 accumulates the phase offset value from the first phase detector 12. When the DPLL1 is locked, the output of the first phase detector 12 is zero (on average), which means the frequency offset value provided to the first digitally-controlled oscillator 16 consists of only the value of the accumulator 14a. In general, in a DPLL using this type of first loop filter 14, phase corrections are done through the straight line between the first phase detector 12 and the first digitally-controlled oscillator 16, whereas frequency corrections are done through the accumulator 14a. In this manner, the frequency offset value provided to the first digitally-controlled oscillator (DCO) 16 is a summation of a short term phase correction and a longer term frequency correction.

As further shown by FIG. 7, the DPLL2 loop filter 24 includes an accumulator 24a and a first adder 24b, which collectively operate as a low pass filter, and a second adder 24c, which receives a frequency offset value from the first loop filter 14. The multiplexer 24d is also provided because only one of the phase-input or frequency-input is provided by the host processor 104, which runs a 1588 algorithm. In this manner, the full filter functionality of the DPLL2 loop filter 24 may be achieved by using the phase-input or the filter functionality of the loop filter 24 may be bypassed by using the frequency-input. In this latter case, just the summation at the second adder 24c is used.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit device, comprising:
  a pair of coupled phase-locked loops including a first phase-locked loop responsive to a first clock and a second phase-locked loop configured to track the first clock through the first phase-locked loop when said second phase-locked loop is disposed in a holdover mode of operation and in a locked mode of operation, said first phase-locked loop comprising a first loop filter and a first oscillator responsive to a first output signal generated by the first loop filter and said second phase-locked loop comprising a second loop filter responsive to a second output signal generated by the first loop filter;
  wherein the first loop filter comprises a low-pass filter; and
  wherein said first phase-locked loop is configured to support a first programmable mode whereby the first and second output signals generated by the first loop filter are equivalent and a second programmable mode whereby the second output signal is generated by the low-pass filter but the first output signal is not.

2. The integrated circuit device of claim 1, wherein the first oscillator is a digitally-controlled oscillator; and wherein said second phase-locked loop comprises a second digitally-controlled oscillator responsive to an output signal generated by the second loop filter.

3. A Synchronous Ethernet (SyncE) network device, comprising:
  a pair of phase-locked loops including a first phase-locked loop responsive to a SyncE input clock and a second phase-locked loop coupled to the first phase-locked loop, said second phase-locked loop configured to be simultaneously lockable to both the SyncE input clock via the first phase-locked loop and an IEEE 1588 packet stream during a locked mode of operation and lockable to the SyncE input clock during a holdover mode of operation that is triggered in response to a failure of the IEEE 1588 packet stream.

4. The network device of claim 3, wherein the first phase-locked loop comprises a first loop filter and a first digitally-controlled oscillator; and wherein the first loop filter comprises selection circuitry configured to selectively provide a second loop filter within the second phase-locked loop with the same frequency offset provided to the first digitally-controlled oscillator when disposed in a first selection state.

5. The network device of claim 4, wherein the selection circuitry is further configured to selectively provide the second loop filter with a long term frequency offset of the first phase-locked loop when disposed in a second selection state.

6. The network device of claim 5, wherein the first phase-locked loop comprises a low pass filter configured to receive the long term frequency offset of the first phase-locked loop; and wherein the selection circuitry is further configured to selectively provide the second loop filter with a post-filtered frequency offset from an output of the low pass filter when disposed in a third selection state.

7. The network device of claim 3, wherein the second phase-locked loop comprises a phase detector, a loop filter and selection circuitry electrically coupled to the phase detector and the loop filter; said selection circuitry configured to selectively pass a phase offset signal from an output of the phase detector to an input of the loop filter when disposed in a first selection state and pass phase information associated with the IEEE 1588 packet stream to the input of the loop filter when disposed in a second selection state.

8. The network device of claim 7, wherein the phase information associated with the IEEE 1588 packet stream is received at a serial interface of the network device.

9. The network device of claim 7, wherein said second phase-locked loop is configured to generate a one-pulse-per-second (1PPS) timing signal at an output thereof, which is also fed back to a first input of the phase detector.

10. The network device of claim 9, wherein said second phase-locked loop comprises a divider configured to generate the 1PPS timing signal in response to an output clock signal; and wherein the phase information associated with the IEEE 1588 packet stream is received at a serial interface of the network device and provided to an input of the divider.

* * * * *